(12) United States Patent
Corisis

(10) Patent No.: US 6,537,850 B1
(45) Date of Patent: Mar. 25, 2003

(54) METHOD FOR FABRICATING SEMICONDUCTOR COMPONENTS WITH TERMINAL CONTACTS HAVING ALTERNATE ELECTRICAL PATHS

(75) Inventor: David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/123,328

(22) Filed: Apr. 15, 2002

Related U.S. Application Data

(63) Continuation of application No. 09/811,179, filed on Mar. 16, 2001, now Pat. No. 6,392,291.

(51) Int. Cl.[7] .............................................. H01L 21/44
(52) U.S. Cl. ...................... 438/106; 438/106; 438/108; 438/118; 438/126; 438/612; 438/613; 438/620
(58) Field of Search ................................ 438/106, 108, 438/118, 126, 612, 613, 620, 669, 735

(56) References Cited

U.S. PATENT DOCUMENTS

| | | |
|---|---|---|
| 6,048,755 A | 4/2000 | Jiang et al. |
| 6,097,087 A | 8/2000 | Farnworth et al. |
| 6,118,179 A | 9/2000 | Farnworth et al. |
| 6,180,504 B1 | 1/2001 | Farnworth et al. |
| 6,232,147 B1 | 5/2001 | Matsuki et al. |

OTHER PUBLICATIONS

Lau, John H., "Reliability of Ceramic Ball Grid Array Assembly", Ball Grid Array Technology, 1995, pp. 225–265, McGraw Hill.

*Primary Examiner*—David Nelms
*Assistant Examiner*—Mai-Huong Tran
(74) *Attorney, Agent, or Firm*—Stephen A. Gratton

(57) ABSTRACT

A semiconductor component includes a substrate, bonding pads on the substrate, and terminal contacts bonded to the bonding pads. Exemplary components include semiconductor packages, semiconductor wafers and semiconductor dice. Exemplary terminal contacts include contact balls, contact bumps and contact columns. In each case, the terminal contacts can be arranged in a dense array, such as a ball grid array (BGA), or fine ball grid array (FBGA). The component also includes patterns of primary conductors on the substrate in electrical communication with the bonding pads and with the terminal contacts. Selected terminal contacts, particularly those most likely to experience fatigue failure due to thermal loads, are in electrical communication with the primary conductors and also with one or more secondary conductors. The secondary conductors are configured to provide alternate electrical paths for the selected terminal contacts should damage occur to the primary conductors. In addition, the secondary conductors are configured to rigidify the bonding pads and terminal contacts so that separation from the substrate is less likely to occur.

20 Claims, 10 Drawing Sheets

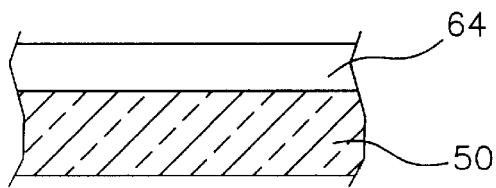
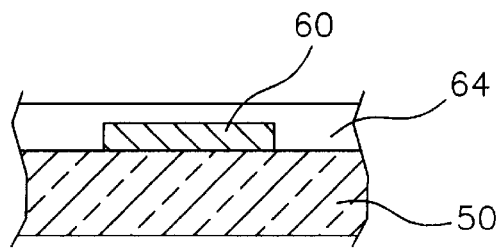
FIGURE 2D          FIGURE 2E
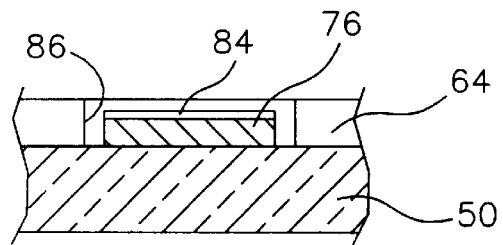
FIGURE 2F
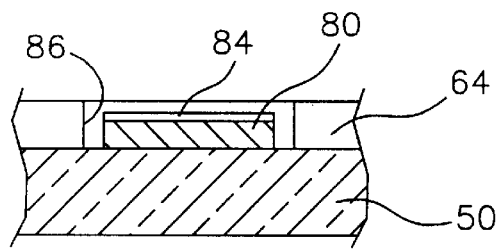
FIGURE 2G

METHOD FOR FABRICATING SEMICONDUCTOR COMPONENTS WITH TERMINAL CONTACTS HAVING ALTERNATE ELECTRICAL PATHS

CROSS REFERENCE TO RELATED APPLICATIONS

This application is a continuation of application Ser. No. 09/811,179, filed Mar. 16, 2001 now U.S. Pat. No. 6,392, 291.

This application is related to application Ser. No. 10/023, 036 filed Dec. 19, 2001.

FIELD OF THE INVENTION

This invention relates generally to semiconductor manufacture, and more particularly to an improved semiconductor component, and to a method for fabricating the component.

BACKGROUND OF THE INVENTION

Semiconductor components, such as packages, dice and wafers can include terminal contacts, such as contact balls, contact bumps or contact pins. The terminal contacts are in electrical communication with integrated circuits, and other electrical elements, contained on the components. For some components, such as chip scale packages and BGA packages, the terminal contacts can be arranged in a dense grid array, such as a ball grid array (BGA), or a fine ball grid array (FBGA). The terminal contacts provide an input/output capability for a component, and permit the component to be surface mounted to a supporting substrate, such as a printed circuit board (PCB).

FIG. 1A illustrates a prior art semiconductor component 10 having an array of terminal contacts 12 in the form of contact balls. In this example, the component 10 comprises a semiconductor package, such as a chip scale package, a BGA package, or a FBGA package, having a board-on-chip (BOC) configuration. The terminal contacts 12 are typically formed of a solder alloy such as 95%Pb/5%Sn, 60%Pb/40%Sn, 63%Sn/37%Pb, or 62%Pb/36%Sn/2%Ag. Typically, the terminal contacts 12 have the shape of a sphere, a truncated sphere or a hemispherical bump.

In addition to the terminal contacts 12, the component 10 includes an array of bonding pads 14 formed on its backside for attaching the terminal contacts 12 to the component 10. Typically, the bonding pads 14 comprise a solderable metal such as molybdenum, copper or gold. As shown in FIG. 1D, the component 10 also includes conductors 28, wire bonding pads 44, and wire bonds (not shown), that form separate electrical paths between the terminal contacts 12 and the semiconductor die (not shown) contained in the component 10. In the illustrative embodiment, the component 10 also includes plating conductors 42 that facilitate plating of the bonding pads 14 and the wire bonding pads 38. The component 10 also includes a solder mask 18 for protecting and electrically insulating the conductors 28 and the terminal contacts 12. As shown in FIG. 1D, the solder mask 18 includes openings 38 aligned with the bonding pads 14 and with the wire bonding pads 44.

One conventional method for attaching the terminal contacts 12 to the bonding pads 14 uses a solder reflow process. With solder reflow, a layer of eutectic solder is deposited on the bonding pads 14 using a deposition process such as screen printing. A platen can be used to hold the component 10, while the eutectic solder is deposited on the bonding pads 14. Prior to depositing the eutectic solder, a flux (not shown) can be applied to the bonding pads 14 for chemically attacking surface oxides, such that the solder can wet the surfaces to be bonded. The flux also performs a tacking function for the terminal contacts 12 prior to solder reflow. Following application of the flux and eutectic solder, the terminal contacts 12 can be placed on the bonding pads 14 in physical contact with the eutectic solder. A fixture can be used to center and maintain the terminal contacts 12 on the bonding pads 14.

Following placement of the terminal contacts 12 on the bonding pads 14, the component 10 can be placed in a furnace at a temperature sufficient to reflow the eutectic solder and form solder joints 16. The solder joints 16 metallurgically bond the terminal contacts 12 to the bonding pads 14. FIG. 1C clearly shows the solder joints 16 and the terminal contacts 12 bonded to the bonding pads 14. The component 10 can then be removed from the furnace and cooled. As an alternative to a solder reflow performed in a furnace, the bonding process can be performed using a pulse-thermode, a hot-air thermode, or a laser. A solder ball bumper, for example, uses a laser to form the eutectic solder joints 16, and bond the terminal contacts 12 to the bonding pads 14. Alternately, the terminal contacts 12 can be bonded to the bonding pads 14 by brazing, by welding, or by application of a conductive adhesive.

As shown in FIG. 1A, following the bonding process, the component 10 is typically surface mounted to a supporting substrate 20, such as a printed circuit board (PCB), a FR-4 card, or a module substrate to form an electronic assembly 22. For attaching the component 10 to the substrate 20, additional eutectic solder joints 24 bond the terminal contacts 12 on the component 10 to an array of contact pads 26 on the supporting substrate 20. A solder reflow process, as previously described, can be used to form the solder joints 24, and to bond the terminal contacts 12 to the contact pads 26 on the supporting substrate 20.

One factor that can adversely affect the reliability of the assembly 22 during operation in different environments are fatigue failures of the terminal contacts 12 and the bonding pads 14. Typically, these fatigue failures are induced by thermal expansion mismatches between the component 10 and the supporting substrate 20. For example, if the component 10 comprises a first material, such as ceramic or plastic having a first CTE, and the supporting substrate 20 comprises a second material, such as FR-4 having a second CTE, cyclic loads can be placed on the terminal contacts 12 and on the bonding pads 14 as the assembly 22 is thermally cycled during operation. As shown in FIG. 1C, the forces acting on the terminal contacts 12 and on the bonding pads 14 include tensile forces 31T, moment forces 31M and shear forces 31S.

These forces acting on the terminal contacts 12 and on the bonding pads 14 can also occur during testing of the component following the fabrication process. In particular, semiconductor manufacturers routinely test the components by placement on test boards having sockets for holding the component 10. During these tests the component 10 can be subjected to temperature cycling. As the socket and component 10 typically have different CTEs, cyclic loads as described above, can be placed on the terminal contacts 12 and on the bonding pads 14.

One aspect of the fatigue failures is that some of the terminal contacts 12 and bonding pads 14 are much more likely to fail because they experience the highest loads. FIG. 1B illustrates this phenomena. In FIG. 1B, the relative displacement of the terminal contacts 12 in the X direction is plotted on the left hand Y axis. Nominal shear strain experienced by the terminal contacts 12 is plotted on the right hand Y axis. Also in FIG. 1B, the terminal contacts 12 have been labeled A1–J1 on the X axis. The inner row adjacent to the A1–J1 row would be the A2–J2 row.

Line 30 of FIG. 1B represents nominal shear strain on the terminal contacts 12. Line 32 of FIG. 1B represents relative displacement in the X direction. Line 34 of FIG. 1B represents theoretical displacement were the terminal contacts 12 not soldered to the board 20 (FIG. 1A). As shown in FIG. 1B, the terminal contacts 12, and associated bonding pads 14 on the ends of the component 10 (e.g., A1, J1), move the most in the X direction, and also experience the highest strain. On the other hand, the terminal contacts 12 in the middle of the component (e.g., E1, D1, F1), and their associated bonding pads 14, experience the least movement, and the least amount of strain.

FIGS. 1E and 1F illustrate two possible adverse effects of fatigue failures caused by the forces acting on the terminal contacts 12 and on the bonding pads 14. In FIG. 1E, the bonding pad 14 associated with the A1 terminal contact 12 has separated from the component 10. This situation can cause the conductor 28 which is in electrical communication with the A1 terminal contact 12 to break, preventing signal transmission to and from the A1 terminal contact 12. In FIG. 1F, the bonding pad 14 associated with the A2 terminal contact 12 has separated from the component 10 causing a break 40 in the conductor 28 which is in electrical communication with the A2 terminal contact 12. The break 40 can result from the forces placed on the terminal contact 12, in combination with micro cracks that are introduced during manufacture. The break 40 in the conductor 28 shorts the electrical path, such that signal transmission between the A2 terminal contact 12 and the die (not shown) is not possible.

In view of the foregoing, improved semiconductor components having improved terminal contacts, bonding pads and conductors are needed in the art. The present invention is directed to a semiconductor component in which multiple electrical paths are provided for the terminal contacts, bonding pads and conductors, that are most likely to experience fatigue failures. In addition, the present invention provides a structure that rigidifies and anchors the terminal contacts and bonding pads to the component, such that breaks are less likely to occur.

SUMMARY OF THE INVENTION

In accordance with the present invention, an improved semiconductor component, a method for fabricating the component, and an electronic assembly constructed with the component, are provided. The component includes terminal contacts each of which has a primary electrical path for transmitting and receiving signals. In addition, selected terminal contacts on the component have at least one secondary electrical path configured to replace the primary electrical path should it become damaged.

In a first embodiment, the component comprises a board-on-chip semiconductor package having terminal contacts in the form of contact balls in a ball grid array. The component also includes a substrate, a semiconductor die wire bonded to the substrate, and an encapsulant encapsulating the die. The substrate includes an array of bonding pads for the terminal contacts, a pattern of primary conductors in electrical communication with the bonding pads and wire bonding pads in electrical communication with the conductors. The substrate also includes a solder mask covering the conductors, and having openings aligned with the bonding pads and with the wire bonding pads.

Selected terminal contacts, such as the terminal contacts on the outer edges or corners of the array, are in electrical communication with secondary conductors configured to provide alternate electrical paths to the selected terminal contacts equivalent to the primary electrical paths. With this arrangement, an alternate electrical path becomes operable should damage occur to a primary conductor due to thermally induced loads or other factors. In addition, the secondary conductors are configured to rigidify and anchor the selected terminal contacts and their bonding pads, such that separation from the substrate during loading is less likely to occur.

The method for fabricating the component includes the step of providing the substrate having the bonding pads, the primary conductors in electrical communication with the bonding pads, and the wire bonding pads in electrical communication with the conductors. In addition, the method includes the step of providing secondary electrical conductors in electrical communication with the selected bonding pads. The method also includes the steps of attaching the die to the substrate, wire bonding the die to wire bonding pads, and then bonding the terminal contacts to the bonding pads.

The electronic assembly includes one or more components bonded to a supporting substrate, such as a module substrate or a circuit board. The supporting substrate also includes contact pads configured for bonding to the terminal contacts on the components. During use of the electronic assembly, alternate electrical paths are provided to the selected terminal contacts on the components should damage occur to the primary electrical paths. The alternate electrical paths allow signals to be transmitted to and from the affected terminal contact.

In an alternate embodiment of the invention, the component comprises a bumped semiconductor die or a bumped semiconductor wafer. In another alternate embodiment the component comprises a semiconductor package having terminal contacts in the form of contact columns in a column grid array. In each of the alternate embodiments both primary conductors and secondary conductors are provided to selected terminal contacts.

BRIEF DESCRIPTION OF THE DRAWINGS

FIG. 2D is an enlarged cross sectional view, taken along line 2D—2D of FIG. 2C, illustrating a substrate and solder mask of the component;

FIG. 2E is an enlarged cross sectional view, taken along line 2E—2E of FIG. 2C, illustrating a conductor of the component;

FIG. 2F is an enlarged cross sectional view, taken along line 2F—2F of FIG. 2C, illustrating a wire bonding pad of the component;

FIG. 2G is an enlarged cross sectional view, taken along line 2G—2G of FIG. 2C, illustrating a bonding pad for a terminal contact of the component;

DETAILED DESCRIPTION OF THE PREFERRED EMBODIMENT

Figure 1A:
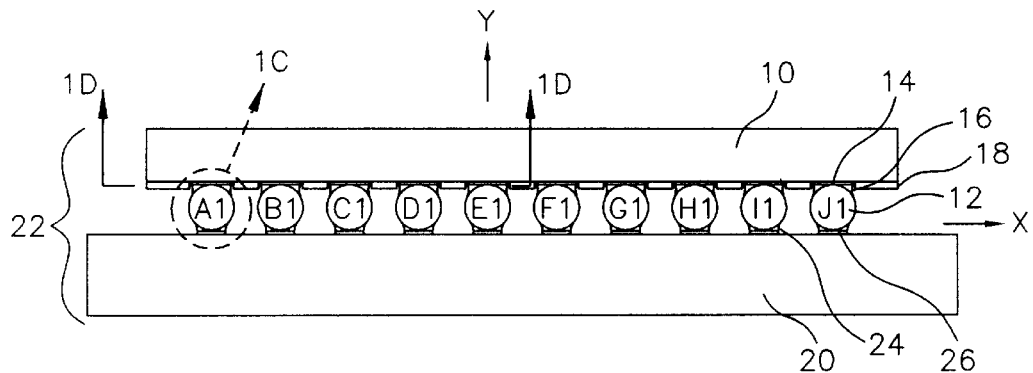
FIG. 1A is an enlarged side elevation view illustrating a prior art semiconductor component bonded to a supporting substrate in an electronic assembly.
Figure 1B:
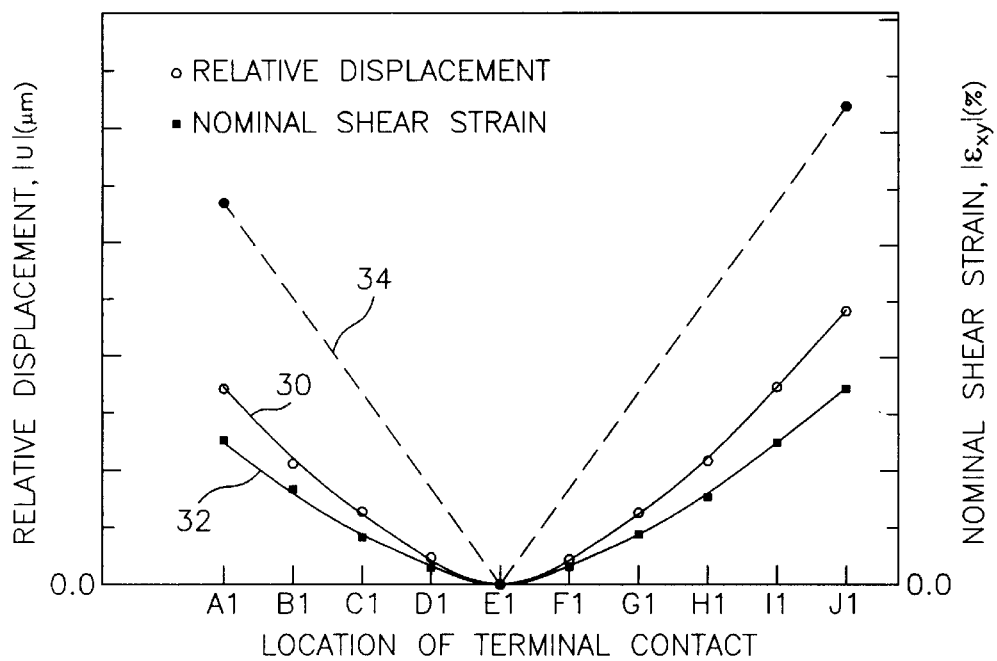
FIG. 1B is graph illustrating relative shear displacement in the X direction, and shear strain plotted as a function of the location of the terminal contacts for the prior art component.
Figure 1C:
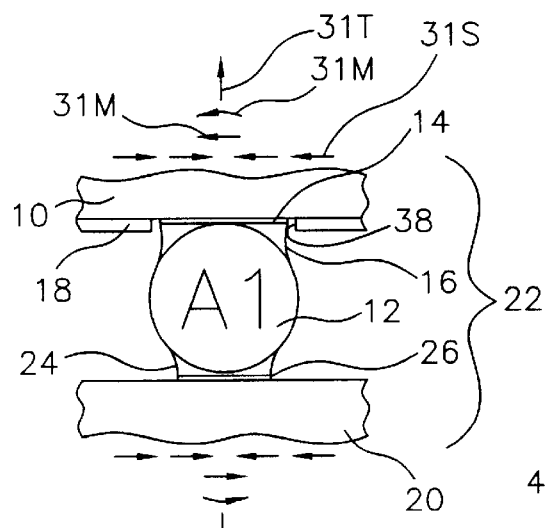
FIG. 1C is an enlarged cross sectional view, taken along line 1C of FIG. 1A, illustrating a single terminal contact on the prior art component.
Figure 1E:
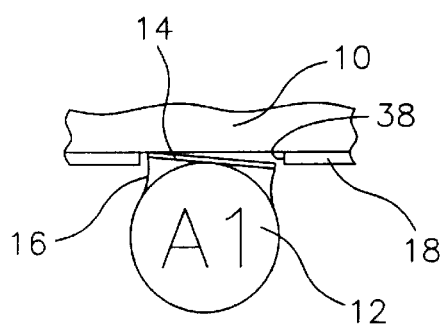
FIG. 1E is an enlarged cross sectional view, taken along line 1E—1E of FIG. 1D, illustrating the A1 terminal contact on the prior art component.
Figure 1D:
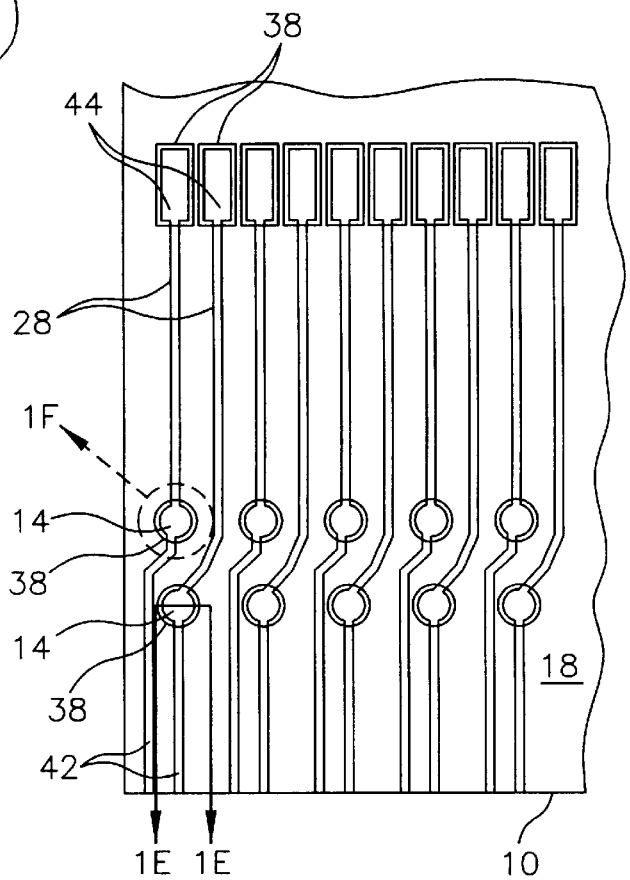
FIG. 1D is an enlarged cross sectional view, taken along line 1D—1D of FIG. 1A, illustrating a pattern of bonding pads and conductors for the terminal contacts on the prior art component.
Figure 1F:
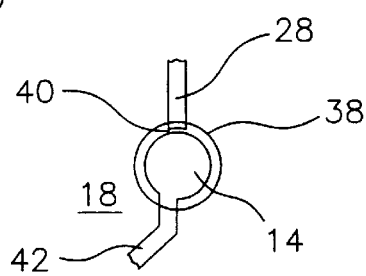
FIG. 1F is an enlarged cross sectional view, taken along line 1F of FIG. 1D, illustrating a bonding pad and conductor for the A2 terminal contact on the prior art component.
Figure 2A:
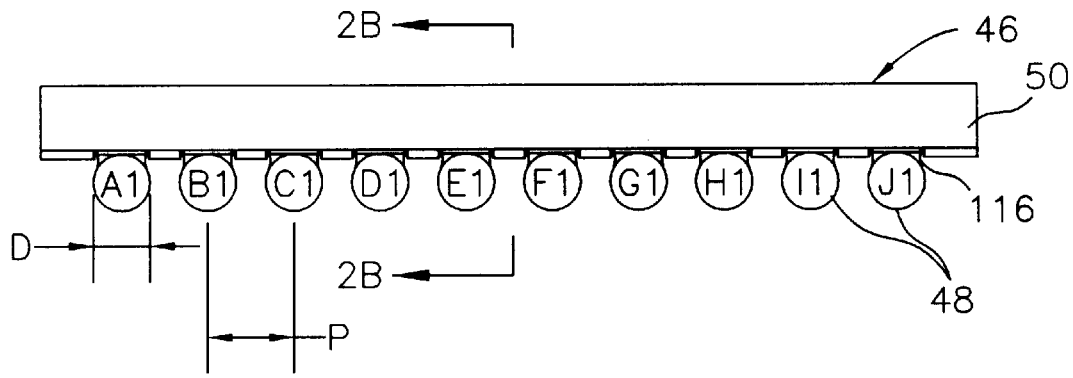
FIG. 2A is an enlarged schematic side elevation view illustrating a semiconductor component, in the form of a semiconductor package, constructed in accordance with the invention.
Figure 2B:
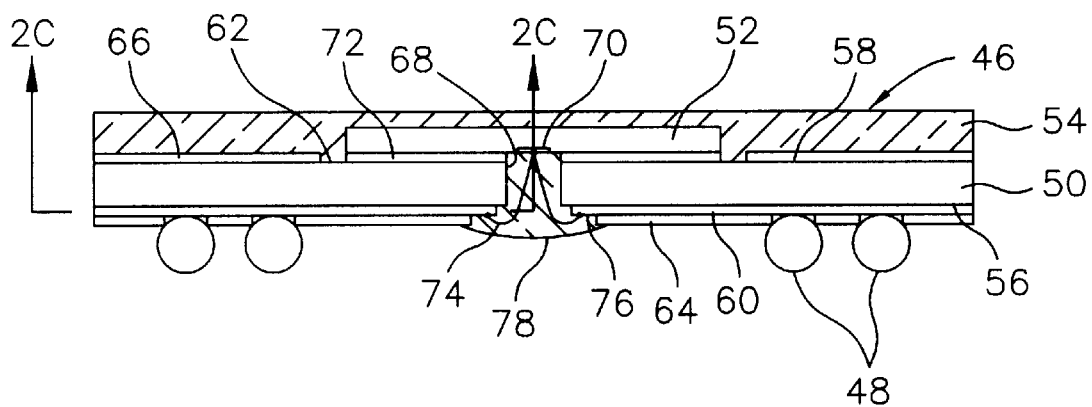
FIG. 2B is an enlarged cross sectional view of the component, taken along line 2B—2B of FIG. 2A.

Referring to FIGS. 2A and 2B, a semiconductor component 46 constructed in accordance with the invention is illustrated. As used herein, the term "semiconductor component" refers to an element, or to an assembly, that includes a semiconductor die. In the illustrative embodiment, the component 46 comprises a board-on-chip (BOC) semiconductor package. However, the semiconductor component 46 can comprise another type of semiconductor package such as a chip-on-board (COB) package, a chip scale package (CSP), a BGA device, or a bumped semiconductor die. The semiconductor component can also comprise a semiconductor wafer containing multiple semiconductor dice.

The component 46 includes a substrate 50 having a first surface 56 (FIG. 2B), and an opposing second surface 58 (FIG. 2B). The first surface 56, and the second surface 58, are the major planar surfaces of the substrate 50. The substrate also includes a wire bonding opening 68 therethrough, extending from the first surface 56 to the second surface 58. In addition, the substrate 50 includes a pattern of primary conductors 60 (FIG. 2B) formed on the first surface 56, and a corresponding die attach area 62 formed on the second surface 58. The substrate 50 also includes a solder mask 64 on the first surface 56, and a solder mask 66 on the second surface 58.

The substrate 50 comprises an electrically insulating material such as an organic polymer resin reinforced with glass fibers. Suitable materials for the substrate 50 include bismaleimide-triazine (BT), epoxy resins (e.g., "FR-4" and "FR-5"), and polyimide resins. These materials can be formed with a desired thickness, and then punched, machined, or otherwise formed with a required peripheral configuration, and with required features. A representative thickness of the substrate 50 can be from about 0.2 mm to 1.6 mm.

In addition to the substrate 50, the component 46 includes an array of terminal contacts 48 on the substrate 50 in electrical communication with integrated circuits, or other electrical elements contained on the component 46. The terminal contacts 48 provide separate electrical connection points for transmitting (writing) and receiving (reading) electronic signals from the component 46. In addition, the terminal contacts 48 provide a structure for bonding the component 46 to a supporting substrate. In the illustrative embodiment, the terminal contacts 48 comprise generally spherically shaped contact balls in a ball grid array (BGA), or a fine ball grid array (FBGA). However, the terminal contacts 48 can comprise other conventional contacts having other shapes, and arranged in other patterns, to provide multiple electrical connection points for the component. By way of example, representative contacts include bumps, columns, studs, domes and cones. Also, the terminal contacts can be made of any electrically conductive material, such as a solder alloy as previously discussed, copper, nickel, or a conductive polymer.

As shown in FIG. 2A, the terminal contacts 48 have a diameter "D" and a spacing or pitch "P". With the terminal contacts 48 comprising contact balls in a ball grid array, or a fine ball grid array, a representative range for the diameter D can be from about 0.127 mm (0.005 inch) to 0.762 mm (0.030 inch). A representative range for the pitch P can be from about 0.228 mm (0.008 inch) to 2.0 mm (0.078 inch). For convenience, the terminal contacts 48 are labeled with a letter and a numeral (A1–J1) that indicate their location in the grid array.

As shown in FIG. 2B, the component 46 also includes a semiconductor die 52, and a die encapsulant 54 on the die 52 and on the second surface 58 of the substrate 50. The die 52 includes a row of bond pads 70 formed on a face portion thereof, in electrical communication with the integrated circuits contained in the die 52. The die 52 is bonded face down to the die attach area 62 of the substrate 50 with the bond pads 70 on the die 52 aligned with the bonding opening 68 in the substrate 50.

An adhesive layer 72 bonds the die 52 to die attach area 62 of the substrate 50. The adhesive layer 72 can comprise a filled epoxy, an unfilled epoxy, an acrylic, a polyimide or an adhesive tape material. In addition, wires 74 are placed through the wire bonding opening 68 in the substrate 50 and are wire bonded to the bond pads 70 on the die 52, and to corresponding wire bonding pads 76 (FIG. 2C) on the substrate 50. A wire bond encapsulant 78 fills the wire bonding opening 68 and encapsulates the wires 74. The wire bond encapsulant 78 can comprise a glob top polymer material, such as epoxy or silicone, deposited in a desired shape using a suitable process such as dispensing through a nozzle. The encapsulant 54 can comprise a Novolac based epoxy formed in a desired shape using a transfer molding process, and then cured using an oven.

Figure 2C:
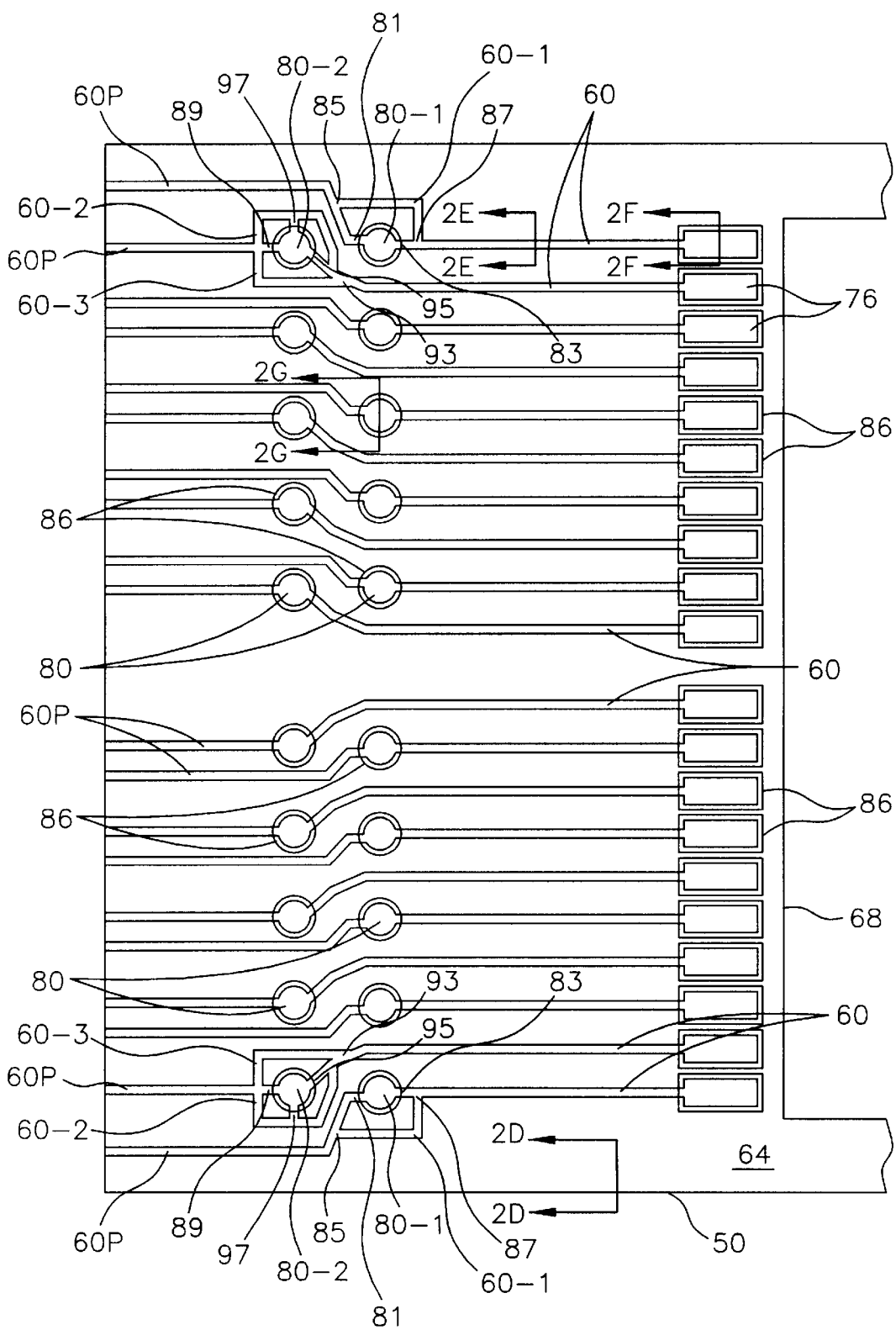
FIG. 2C is an enlarged cross sectional view, taken along line 2C—2C of FIG. 2B, illustrating bonding pads and conductors of the component.

Referring to FIG. 2C, the component 46 (FIG. 2A) also includes bonding pads 80 on the substrate 50 for bonding the terminal contacts 48 to the substrate 50. The bonding pads 80 are in electrical communication with the primary conductors 60 and the wire bonding pads 76. In addition, the bonding pads 60 are in electrical communication with plating conductors 60P on the substrate 50 that extend to an edge of the substrate 50. The plating conductors 60P are initially connected to plating buses 82, which are used to apply a current to the bonding pads 80 and to the wire bonding pads 76 for plating a non-oxidizing metal layer 84 (FIGS. 2F and 2G) such as gold on the bonding pads 80 and the wire bonding pads 76. As shown in FIGS. 2D and 2E, the solder mask 64 covers the substrate 50 and the conductors 60. However, as shown in FIGS. 2F and 2G, the solder mask 64 includes openings 86 aligned with the bonding pads 80 and the wire bonding pads 76.

As also shown in FIG. 2C, selected bonding pads 80-1 on the ends of the array include secondary conductors 60-1. These secondary conductors 60-1 provide alternate electrical paths for the selected bonding pads 80-1 should the conductors 60 break as previously described. In addition, the secondary conductors 60-1 help to anchor the selected bonding pads 80-1 and associated terminal contacts 48 to the substrate 50.

As shown in FIG. 2C, the secondary conductor 60-1 is attached to the bonding pad 80-1 at a connection point 81 which is about 180° from a connection point 83 of the primary conductor 60 to the bonding pad 80-1. In addition, the secondary conductor 60-1 makes about a 90° angle to intersect with the plating conductor 60P for the bonding pad 80-1 at connection point 85. The secondary conductor 60-1 then extends along a periphery of the bonding pad 80-1 generally parallel to the primary conductors 60, then makes about a 90° turn to intersect with the primary conductor 60 for the bonding pad 80-1 at a connection point 87. The connection point 87 of the secondary conductor 60-1 with the primary conductor 60 is well past the connection point 83 at which the primary conductor 60 connects to the bonding pad 80-1. As the primary conductor 60 is most likely to break at connection point 83 the secondary conductor 60-1 provides an alternate path around the likely breaking point.

As also shown in FIG. 2C, other selected bonding pads 80-2 on the outside corners of the array include multiple secondary conductors 60-2, 60-3. In particular, the selected bonding pads 80-2 each includes two secondary conductors 60-2, 60-3. Again, the secondary conductors 60-2, 60-3 provide alternate electrical paths, and help to anchor the selected bonding pads 80-1, 80-2 and associated terminal contacts 48 to the substrate 50.

As also shown in FIG. 2C, secondary conductor 60-3 has a connection point 89 with the bonding pad 80-2 proximate to the plating conductor 60P. In addition, secondary conductor 60-3 has a connection point 93 with the primary conductor 60 for the bonding pad 80-2. Again the connection points 91, 93 are located to provide an alternate electrical path around a connection point 95 of the bonding pad 80-2 with the primary conductor 60. Secondary conductor 60-2 has two connection points with the bonding pad 80-2 including a first connection point 89 proximate to the plating conductor 60P, and a second connection point 97 about 90° from the plating conductor 60P.

Figure 3A:
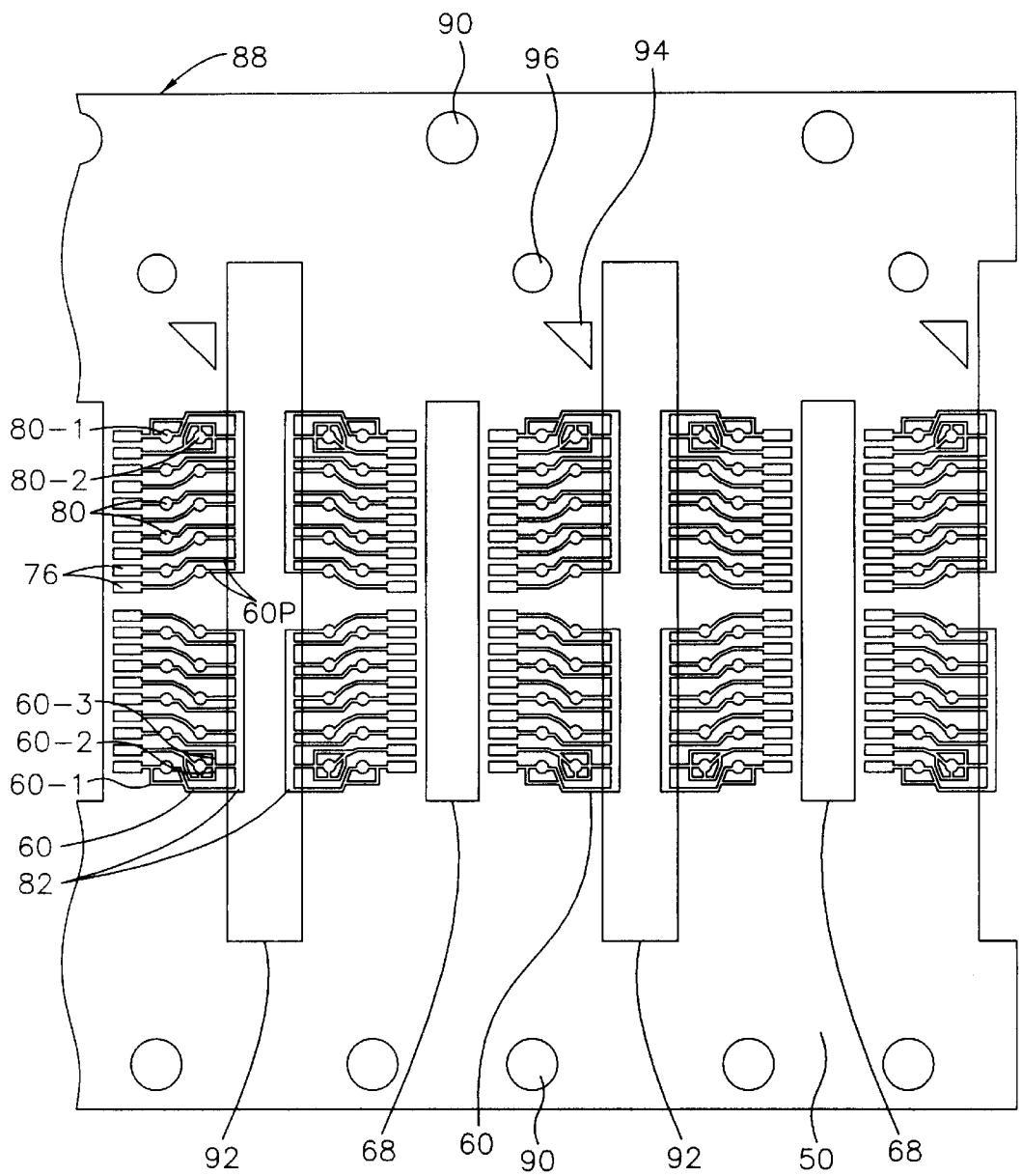
FIG. 3A is an enlarged plan view of a strip containing multiple substrates suitable for fabricating components in accordance with the invention.
Figure 3B:
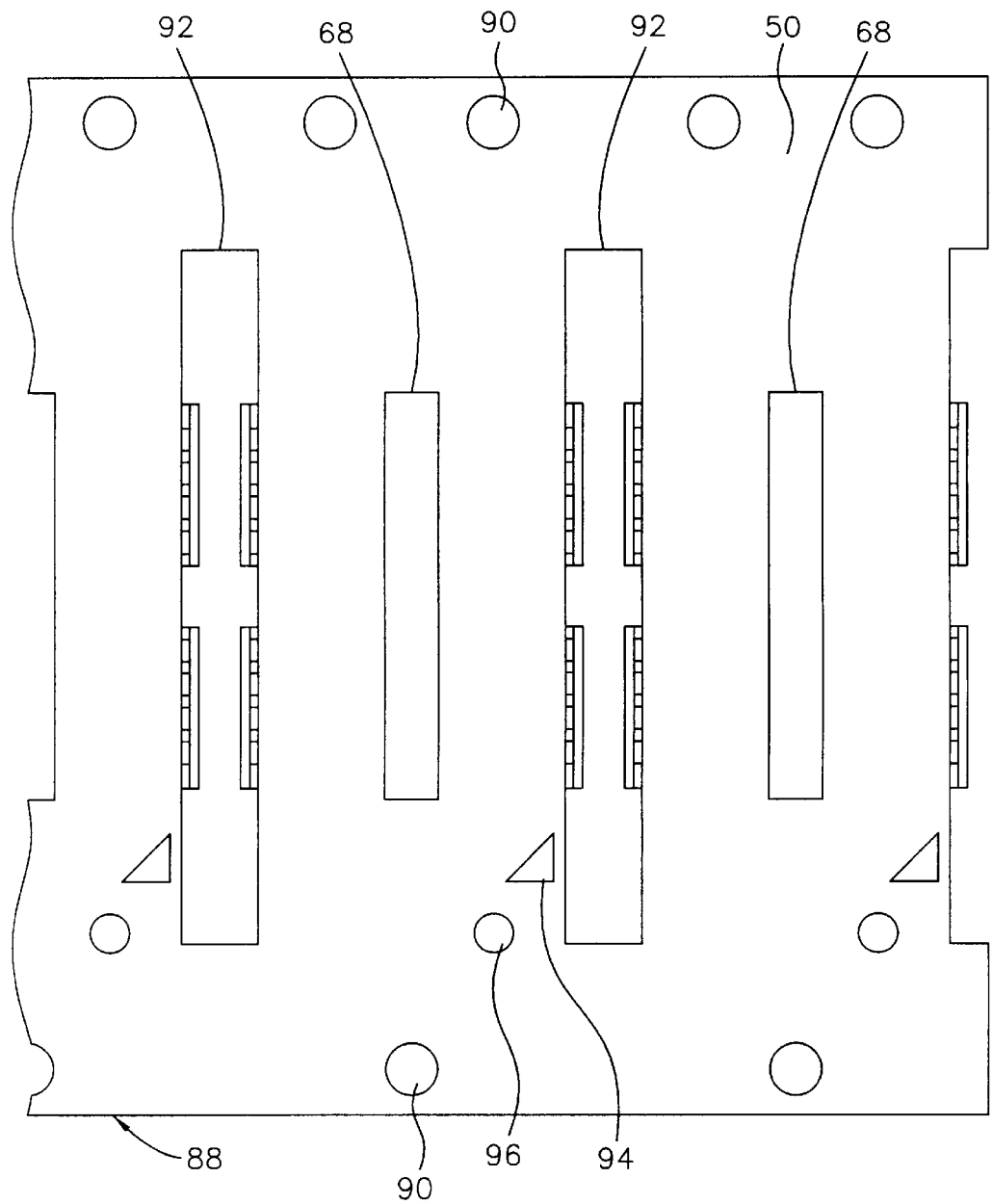
FIG. 3B is an enlarged bottom view of the strip.

Referring to FIGS. 3A and 3B, the substrate 50 can initially comprise a segment of a panel 88. The panel 88 is similar in function to a semiconductor lead frame, and includes multiple substrates 50 permitting the fabrication of multiple components 46 (FIG. 2A) at the same time. The panel 88 includes circular indexing openings 90 proximate to the longitudinal edges thereof. The indexing openings 90 permit the panel 88 to be handled by automated transfer mechanisms associated with chip bonders, wire bonders, molds, and trim machinery. In addition, the panel 88 includes elongated separation openings 92 which facilitate singulation of the substrates 50 on the panel 88 into separate components 46 (FIG. 2A). The plating buses 82 for the plating conductors 60P are located proximate to the separation openings 92, and are severed during singulation of the substrates 50.

The primary conductors 60, secondary conductors 60-1, 60-2, 60-3, plating conductors 60P, bonding pads 80 and wire bonding pads 76 can comprise a highly conductive metal layer, which is blanket deposited onto the panel 88 (e.g., electroless or electrolytic plating), and then etched in required patterns. Alternately, an additive process, such as electroless deposition through a mask, can be used. Suitable metals include copper, aluminum, titanium, tungsten, tantalum, platinum, molybdenum, cobalt, nickel, gold, and iridium. If desired, the panel 88 can be constructed from a commercially produced bi-material core, such as a copper clad bismaleimide-triazine (BT) core, available from Mitsubishi Gas Chemical Corp., Japan. A representative weight of the copper can be from 0.5 oz to 2 oz. per square foot.

As also shown in FIGS. 3A and 3B, the panel 88 also includes triangular metal segments 94, and circular metal segments 96 for each substrate 50. The metal segments 94, 96 can comprise a same metal as the conductors 60. The triangular metal segments 94 function as pin #1 indicators. The circular metal segments 96 function as alignment fiducials.

Figure 4A:
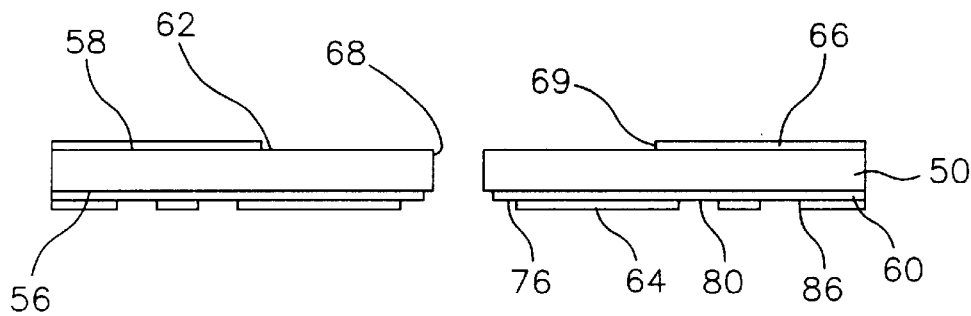
FIGS. 4A—4C are schematic cross sectional views illustrating steps in a method for fabricating the component of FIG. 2A.
Figure 4B:
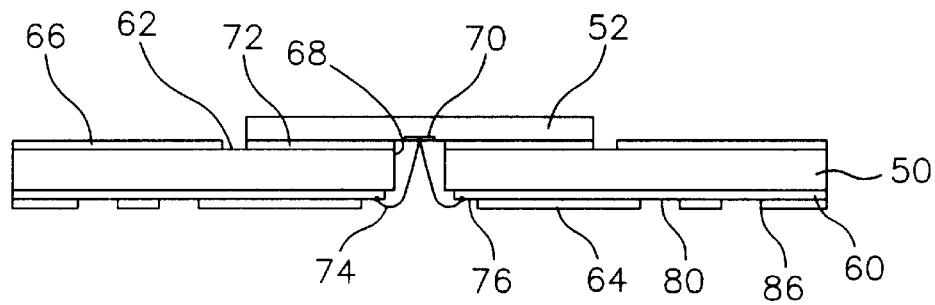
Figure 4C:
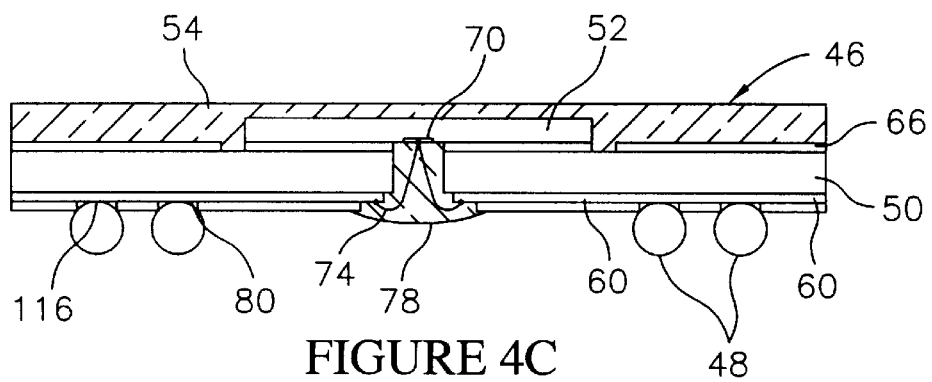

Referring to FIGS. 4A–4C, steps in a method for fabricating the component 46 are illustrated. Although these steps are shown as being performed on a single substrate 50, it is to be understood that the steps are performed on each of the substrates 50 contained on the panel 88, substantially at the same time. Initially, as shown in FIG. 4A, the substrate 50 can be provided with the primary conductors 60, the secondary conductors 60-1, 60-2, 60-3, the plating conductors 60P, the bonding pads 80 and the wire bonding pads 76. In addition, the die attach area 62 can include the wire bonding opening 68 formed through the substrate 50.

As also shown in FIG. 4A, the solder masks 64, 66 can be formed by blanket depositing, exposing and then patterning a photoimageable dielectric material, such as a negative or positive tone resist. The solder mask 64 on the first surface 56 of the substrate 50 includes openings 86 aligned with the bonding pads 80 and the wire bonding pads 76. The solder mask 66 on the second surface 58 of the substrate 50 includes an opening 69 having an outline that is slightly larger than the outline of the semiconductor die 52. One suitable resist is commercially available from Taiyo America, Inc., Carson City, Nev., under the trademark "PSR-4000". The "PSR-4000" resist can be mixed with an epoxy such as epoxy "720" manufactured by Ciba-Geigy (e.g., 80% PSR-4000 and 20% epoxy "720"). Another suitable resist is commercially available from Shipley under the trademark "XP-9500". Following forming of the solder masks 64, 66 the bonding pads 80 and the wire bonding pads 76 can be plated with the non-oxidizing layers 84 (FIGS. 2F and 2G) using the plating bus 82 (FIG. 3A), and electrolytic deposition of a non-oxidizing metal (e.g., gold) through the openings 86 in the solder mask 64.

Next, as shown in FIG. 4B, the die 52 can be bonded to the substrate 50 using the adhesive layer 72. A conventional die attacher can be used to form the adhesive layer 72 and adhesively bond the die 52 to the substrate 50. As also shown in FIG. 4B, following attachment of the die 52 to the substrate 50, the wires 74 can be wire bonded to the wire bonding pads 76, and to the bond pads 70 on the die 52. A conventional wire bonder can be used to perform the wire bonding step. Although in the illustrative embodiment, the die 52 is mounted face down to the substrate 50, the die 52 can alternately be back bonded to the substrate 50, and wire bonded to conductors located on a same surface of the substrate 50 as the die 52. As an alternative to wire bonding, a flip chip process (e.g., C4), or a TAB bonding process, can be used to electrically connect the die 52 to the conductors 60.

Next as shown in FIG. 4C, following wire bonding, the die encapsulant 54 can be formed on the die 52 and on the substrate 50. The die encapsulant 54 can comprise a Novolac based epoxy formed in a desired shape using a transfer molding process, and then cured using an oven. Also, if desired, the wire bond encapsulant 78 can be formed on the wires 74.

As also shown in FIG. 4C, following formation of the die encapsulant 54, the terminal contacts 48 can be bonded to the bonding pads 80. If the terminal contacts 48 comprise solder, a solder reflow process can be employed. Prior to the solder reflow process, solder flux can be deposited on the bonding pads 80 and on the terminal contacts 48. The terminal contacts 48 can then be placed on the bonding pads 80, and a furnace used to form metallurgical solder joints 116 between the terminal contacts 48 and the bonding pads 80.

Figure 5A:
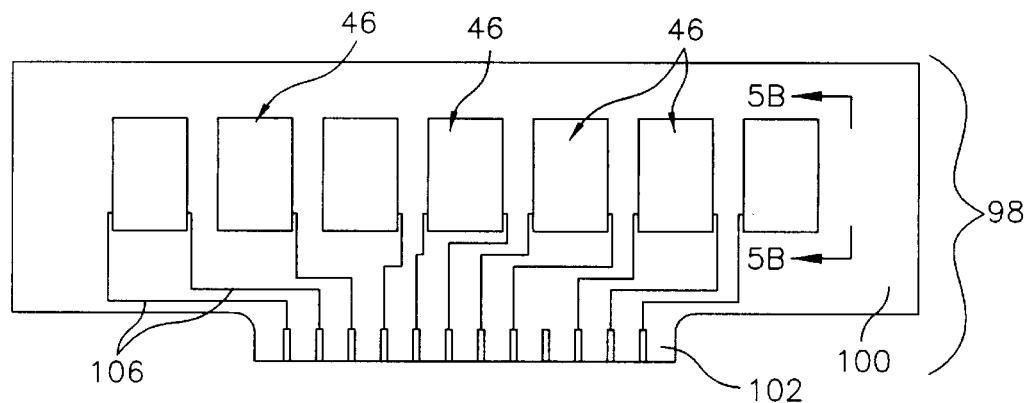
FIG. 5A is a schematic plan view illustrating an electronic assembly fabricated using multiple components constructed in accordance with the invention.
Figure 5B:
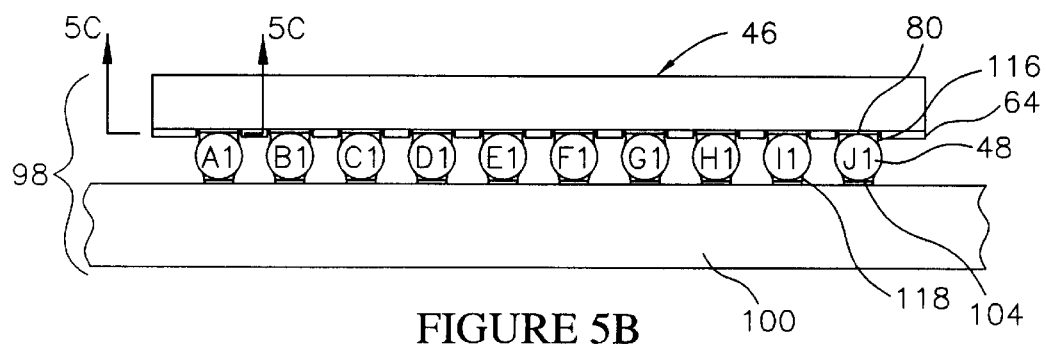
FIG. 5B is an enlarged cross sectional view of the assembly, taken along line 5B—5B of FIG. 5A, illustrating a component bonded to a substrate of the assembly.
Figure 5C:
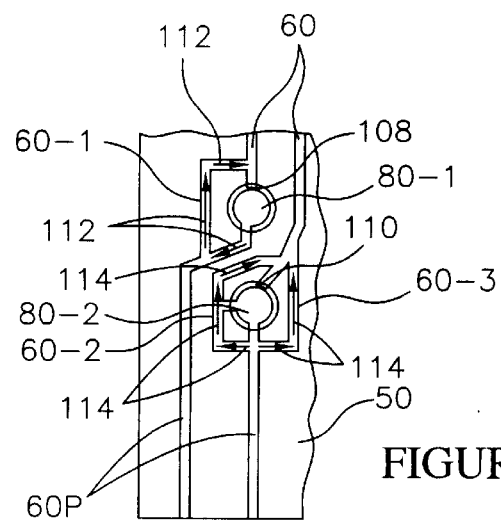
FIG. 5C is an enlarged cross sectional view, taken along line 5C—5C of FIG. 5B, illustrating bonding pads and conductors on the component.

Referring to FIGS. 5A–5C, an electronic assembly 98 constructed in accordance with the invention is illustrated. The electronic assembly 98 includes a supporting substrate 100 and a plurality of the semiconductor components 46 mounted to the supporting substrate 100. In the illustrative embodiment the assembly 98 is in the form of a multi chip module, such as a SIMM or DIMM memory module. However, it is to be understood that the semiconductor component 46 can be used to construct other types of electronic assemblies such as circuit boards, card assemblies, and ball grid array assemblies.

The supporting substrate 100 includes an electrical connector 102, such as an edge connector, and a pattern of conductors 106 in electrical communication with the electrical connector 102. The supporting substrate 100 also includes an array of contact pads 104 (FIG. 5B) having a pattern matching that of the terminal contacts 48 on the components 46. The contact pads 104 are in electrical communication with the conductors 106 and with the electrical connector 102. The terminal contacts 48 on the components 46 are bonded to the contact pads 104 substantially as previously described using solder joints 118 (FIG. 5B).

As shown in FIG. 5C, during operation of the assembly 58 alternate electrical paths are provided for selected bonding pads 80-1, 80-2 should the primary conductors 60 associated with these bonding pads 80-1, 80-2 become damaged. In the illustrative embodiment, alternate electrical paths are provided by the secondary conductor for the bonding pads subject to the highest loads from thermal cycling (e.g., end pads and corner pads of the array) However, it is to be understood that alternate electrical paths can be provided for any or all of the bonding pads of the array.

As shown in FIG. 5C, a break 108 has formed between the primary conductor 60 associated with bonding pad 80-1. However, an alternate electrical path, as indicated by arrows 112, is provided by secondary conductor 60-1. Similarly, a break 110 has formed between the primary conductor 60 associated with bonding pad 80-2. However, two alternate electrical paths, as indicated by arrows 114, are provided by secondary conductors 60-2 and 60-3. In addition, to providing alternate electrical paths, the secondary conductors 60-1, 60-2, 60-3 help to anchor the bonding pads 80-1, 80-2 to the substrate 50, such that the breaks 108, 110 are less likely to occur.

Figure 6A:
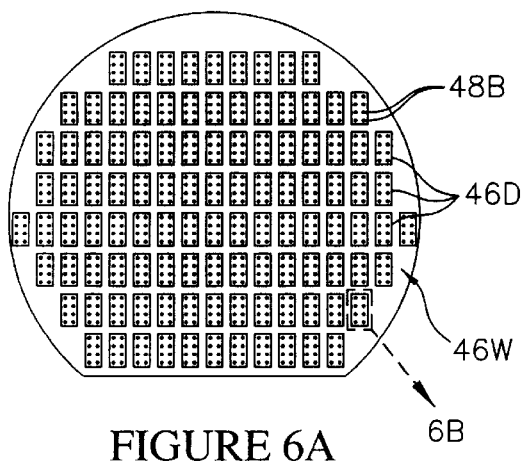
FIG. 6A is a plan view illustrating a semiconductor component, in the form of a semiconductor wafer, constructed in accordance with the invention.
Figure 6C:
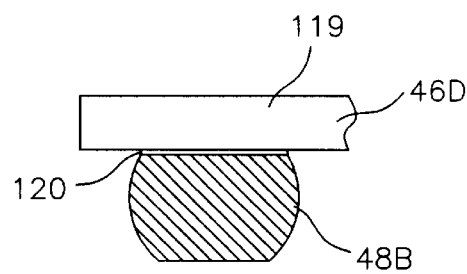
FIG. 6C is an enlarged cross sectional view, taken along line 6C—6C of FIG. 6B, illustrating a bumped terminal contact on the component.
Figure 6B:
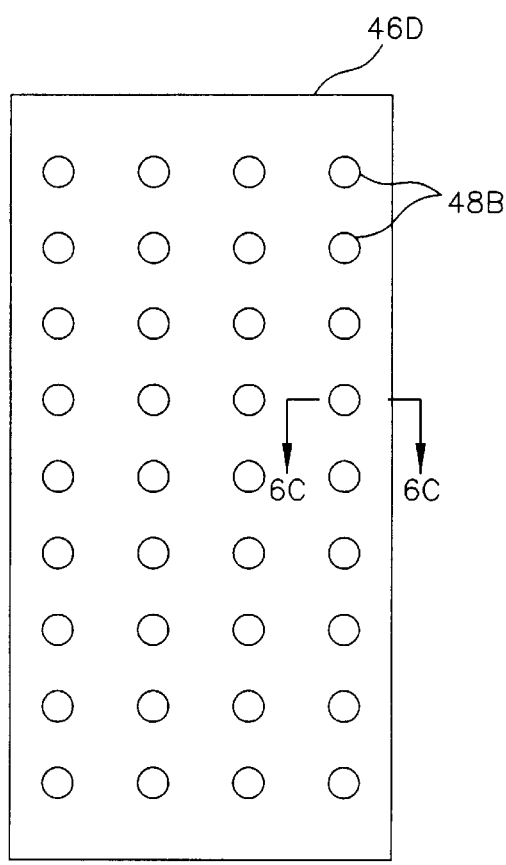
FIG. 6B is a plan view, taken along line 6B of FIG. 6A, illustrating a semiconductor component, in the form of a semiconductor die, constructed in accordance with the invention.

Referring to FIGS. 6A–6C and FIG. 7, alternate embodiment components constructed in accordance with the invention are illustrated. In FIG. 6A, a component 46W comprises a semiconductor wafer containing a plurality of bumped semiconductor dice 46D. As shown in FIG. 6B, each die 46D, following singulation from the wafer, can also be considered a component.

As shown in FIG. 6C, each die 46D includes a semiconductor substrate 119, bond pads 120 on the substrate 119 in electrical communication with the integrated circuits in the substrate 119, and bumped terminal contacts 48B on the bond pads 120. In this embodiment, the bumped terminal contacts 48B can comprise contact bumps formed on the bond pads 120 using a deposition process, such as evaporation of a ball limiting metallurgy (BLM) and solder material through openings in a metal mask. In addition to the bumped terminal contacts 48B, the ball limiting metallurgy (BLM) can include a multi layered stack (not shown) such as an adherence layer (e.g., Cr), a solderable layer (e.g., Cu) and a flash layer (e.g., Au). This process is also known as C4 technology, and is typically used to deposit bumped terminal contacts 46B directly onto bond pads 120 made of aluminum Alternately, other deposition processes, such as electroless deposition, or electrolytic deposition can be used to form the bumped terminal contacts 48B.

Figure 7:
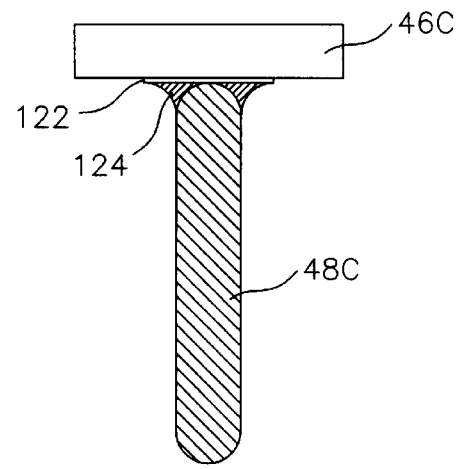
FIG. 7 is a schematic cross sectional view illustrating a semiconductor component, in the form of a package with pin terminal contacts, constructed in accordance with the invention.

As shown in FIG. 7, a component 46C, such as a semiconductor package, includes a bond pad 122 and a column terminal contact 48C bonded to the bond pad 122 using a solder fillet 124. This type of component 46C is sometimes referred to as a ceramic column grid array (CCGA). The column terminal contact 48C comprises an elongated contact column configured for bonding to a corresponding contact pad on a supporting substrate substantially as previously described.

In each of the alternate embodiment components 46W, 46D or 46C, secondary electrical conductors can be provided for selected terminal contacts 48B, 48C substantially as previously described. In addition, the secondary electrical conductors function substantially as previously described to provide alternate electrical paths should the primary conductors in electrical communication with the bond pads 120, 124 become damaged.

Thus the invention provides an improved semiconductor component, a method for fabricating the component, and an electronic assembly constructed using the component. The component includes terminal contacts having multiple electrical conductors that provide alternate electrical paths and a rigidifying structure. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:

providing a substrate;

forming a plurality of terminal contacts on the substrate; and forming a plurality of primary conductors on the substrate in electrical communication with the terminal contacts, and at least one secondary conductor on the substrate configured to provide an alternate electrical path from a selected primary conductor to a selected terminal contact.

2. The method of claim 1 wherein the terminal contacts are arranged in a grid array and the selected terminal contact is located proximate to a corner or an edge of the grid array.

3. The method of claim 1 wherein the primary conductors and the at least one secondary conductor comprise a metal layer on the substrate.

4. A method for fabricating a semiconductor component comprising:

providing a substrate;

forming a plurality of primary conductors on the substrate;

forming a plurality of terminal contacts on the substrate in electrical communication with the primary conductors; and forming at least one secondary conductor on the substrate configured to provide an alternate electrical between a selected primary conductor and a selected terminal contact.

5. The method of claim 4 wherein the at least one secondary conductor is configured to anchor the selected terminal contact to the substrate.

6. The method of claim 4 further comprising providing a second secondary conductor in electrical communication with the selected terminal contact.

7. The method of claim 4 wherein the primary conductors and the at least one secondary conductor comprise a metal layer on the substrate.

8. A method for fabricating a semiconductor component comprising:

providing a substrate;

providing a plurality of pads on the substrate;

providing a plurality of conductors on the substrate in electrical communication with the pads;

providing at least one secondary conductor on the substrate configured to provide an alternate electrical path to a selected pad;

attaching a die to the substrate in electrical communication with the conductors; and forming a plurality of terminal contacts on the pads.

9. The method of claim 8 further comprising at least partially encapsulating the die.

10. The method of claim 8 wherein the terminal contacts comprise contact balls, contact bumps or contact columns.

11. A method for fabricating a semiconductor component comprising:

providing a substrate comprising a terminal contact and a primary conductor in electrical communication with the terminal contact;

attaching a die to the substrate in electrical communication with the primary conductor;

providing a secondary conductor on the substrate configured to provide an alternate electrical path between the primary conductor and the terminal contact;

damaging the primary conductor; and transmitting signals through the terminal contact and the secondary conductor to the die.

12. The method of claim 11 wherein the terminal contact is located proximate to an edge or a corner of a grid array.

13. The method of claim 11 wherein the component comprises a semiconductor package.

14. The method of claim 11 further comprising providing a second secondary conductor configured to provide a second alternate electrical path between the primary conductor and the terminal contact and transmitting the signals through the terminal contact and the second secondary conductor to the die.

15. A method for fabricating a semiconductor component comprising:

providing a substrate;

forming a plurality of terminal contacts on the substrate in a grid array having an outer edge and a corner;

forming a plurality of primary conductors on the substrate in electrical communication with the terminal contacts, and at least one secondary conductor on the substrate in electrical communication with a selected terminal contact proximate to the outer edge or to the corner of the grid array, the secondary conductor configured to provide an alternate electrical path for the selected terminal contact; and attaching a die to the substrate in electrical communication with the primary conductors.

16. The method of claim 15 further comprising providing a second secondary conductor in electrical communication with the selected terminal contact configured to provide a second alternate electrical path for the selected terminal contact.

17. The method of claim 15 wherein the component comprises an element selected from the group consisting of semiconductor packages, semiconductor dice, and semiconductor wafers.

18. A method for fabricating a semiconductor component comprising:

providing a substrate;

attaching a semiconductor die to the substrate;

forming a plurality of conductors on the substrate comprising a plurality of pads;

forming a plurality of terminal contacts on the pads;

forming a secondary conductor on the substrate in electrical communication with a selected pad and with a selected conductor in electrical communication with the selected pad at a connection point;

breaking the connection point; and transmitting signals through the secondary conductor to the die.

19. The method of claim 18 further comprising providing a second secondary conductor in electrical communication with the pad configured to provide a second alternate electrical and transmitting the signals through the second secondary conductor to the die.

20. The method of claim 18 wherein the selected terminal contact is located proximate to an edge or a corner of a grid array.

* * * * *